US012693329B1

(12) United States Patent
Ding et al.

(10) Patent No.: US 12,693,329 B1
(45) Date of Patent: Jul. 28, 2026

(54) SYSTEM AND METHOD FOR AUTOMATING TESTING OF SYSTEM UNDER TEST (SUT)

(71) Applicant: Keysight Technologies, Inc., Santa Rosa, CA (US)

(72) Inventors: Choo Sheong Ding, Singapore (SG); Yong Kheng Seo, Singapore (SG); Hare Ganesh Kandasamy Soundararajan, Singapore (SG); Hau-Jiun Chen, Singapore (SG)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 549 days.

(21) Appl. No.: 17/954,592

(22) Filed: Sep. 28, 2022

(51) Int. Cl.
*G01R 31/28* (2006.01)
*G01R 31/317* (2006.01)

(52) U.S. Cl.
CPC ... *G01R 31/2834* (2013.01); *G01R 31/31718* (2013.01)

(58) Field of Classification Search
CPC ...................... G01R 31/2834; G01R 31/31718
See application file for complete search history.

(56) References Cited

U.S. PATENT DOCUMENTS

| | | | |
|---|---|---|---|
| 8,881,195 | B2 | 11/2014 | Clements |
| 9,429,547 | B1 * | 8/2016 | Kleinbaum .............. C40B 50/14 |
| 10,656,182 | B2 | 5/2020 | Wu |
| 10,725,095 | B2 | 7/2020 | Neeley et al. |
| 11,321,341 | B2 | 5/2022 | Chandhoke et al. |
| 2002/0184326 | A1 * | 12/2002 | Thomson ................... H04L 9/40 |
| | | | 709/208 |

| | | | |
|---|---|---|---|
| 2004/0027138 | A1 * | 2/2004 | Pickerd ................... G01R 13/22 |
| | | | 324/76.19 |
| 2016/0191485 | A1 | 6/2016 | Rajangam et al. |
| 2019/0334616 | A1 * | 10/2019 | Zhong ..................... H04B 10/07 |
| 2021/0109847 | A1 * | 4/2021 | Jaganmohan ........... G06F 18/24 |
| 2022/0083048 | A1 | 3/2022 | Cella et al. |
| 2022/0150115 | A1 * | 5/2022 | Cornish ................. G16H 10/40 |
| 2023/0169399 | A1 * | 6/2023 | Cali ....................... G06N 20/00 |
| | | | 706/12 |

OTHER PUBLICATIONS

Luo, J. et al., "ChartOCR: Data Extraction from Charts Images via a Deep Hybrid Framework," in 2021 IEEE Winter Conference on Applications of Computer Vision (WACV), Waikoloa, HI, USA, 2021, pp. 1916-1924 (Year: 2021).*

* cited by examiner

*Primary Examiner* — Andrew Schechter
*Assistant Examiner* — Ethan Wesley Edwards

(57) ABSTRACT

A method is provided for automating testing of a SUT. The method includes providing an interface on a computing device to test instruments configured for testing the SUT, to software applications, and/or to browsers respectively running on the test instruments; providing an RPA application and an OCR application on the computing device; controlling the test instruments via the interface to perform a measurement of the SUT via the interface using the RPA application according to a predetermined test procedure; receiving test data from the test instruments via the interface in response to the measurement; capturing the test data and translating the captured test data to readable data using the OCR application; repeating the controlling of the test instruments, the receiving and capturing of the test data, and the translating of the captured test data to acquire aggregated test data; and generating a report populated with the aggregated test data.

20 Claims, 5 Drawing Sheets

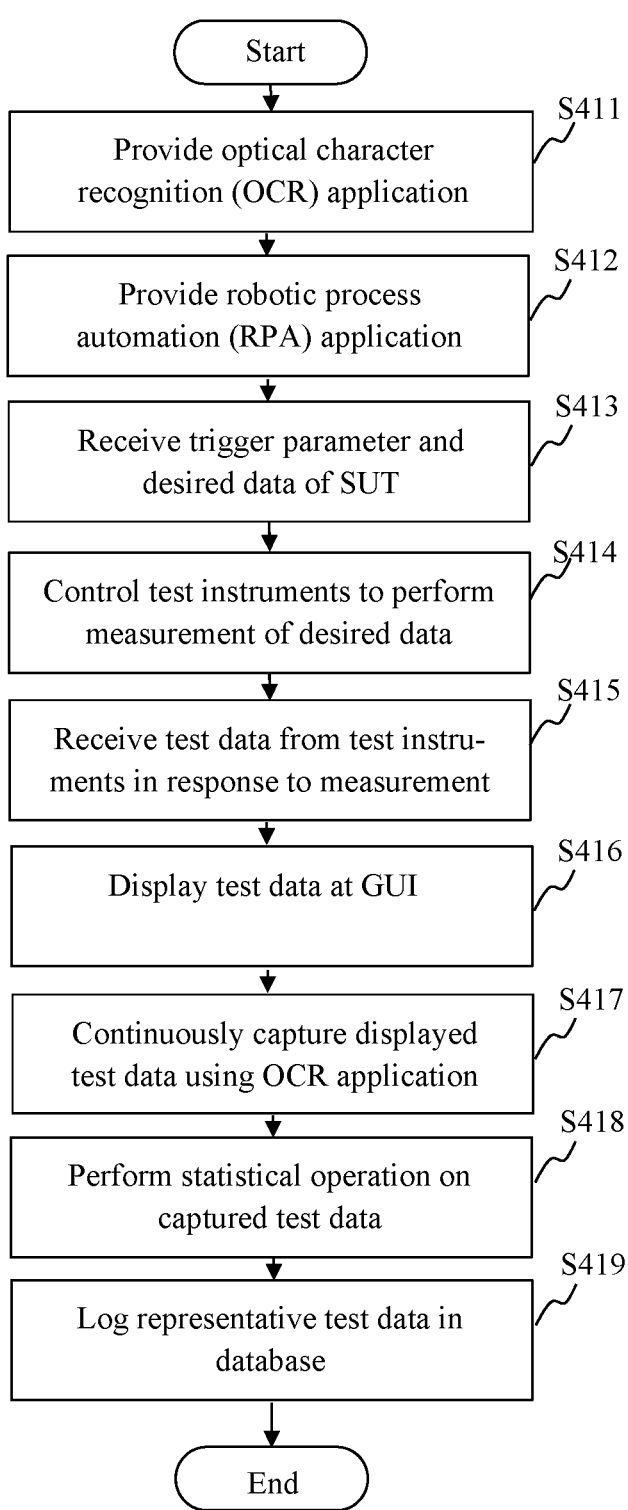

Start

Provide optical character recognition (OCR) application   S411

Provide robotic process automation (RPA) application   S412

Receive trigger parameter and desired data of SUT   S413

Control test instruments to perform measurement of desired data   S414

Receive test data from test instruments in response to measurement   S415

Display test data at GUI   S416

Continuously capture displayed test data using OCR application   S417

Perform statistical operation on captured test data   S418

Log representative test data in database   S419

End

Tolerance

Average

Tolerance

515

Time Duration

SYSTEM AND METHOD FOR AUTOMATING TESTING OF SYSTEM UNDER TEST (SUT)

BACKGROUND

Modern electronic devices are highly complex, and therefore testing of the electronic devices requires data from multiple test instruments, including hardware and software. For example, currently there is no software available that is capable of interfacing with and collecting test data from multiple test instruments across different operating systems, desktop-based software applications, browser simulators, web-based applications and cloud-based applications. There are conventional software products able to connect to multiple types of hardware, including LabVIEW, available from National Instruments Corp., and BenchVue, available from Keysight Technologies. However, these software products do not have the capability to interact with software without the necessary drivers. Conventional test automation tools, such as Eggplant Functional, available from Keysight Technologies, have limited capability to connect to a multiple system under test (SUT), and to automate and remotely operate multiple test and measurement instruments from the connected SUT. Such an interface would require additional hardware and software resources.

In addition, optical character recognition (OCR) applications may be used to capture test data. However, OCR applications are not effective in capturing measurements of dynamic data, the display of such data changes rapidly over time. Traditional logging methods are therefore typically used to capture dynamic data continuously, and to store all of the captured data in a large database. However, the user must then add in an additional step during subsequent parsing and extraction to perform predetermined operations on the captured data, such as averaging, and determining maximum and minimum data values, for example. This additional step is time consuming, and effectively prevents real time analysis of the captured data.

Also, conventional solutions collect log data via scripts or code, which requires large amounts of storage followed by extraction and parsing to obtain data of interest. That is, during product development, research and development (R&D) engineers work with different types of application software and may cross-platform. As a result, the engineers need to write scripts or code, typically using Standard Commands for Programmable Instruments (SCPI) or instrument drivers to perform testing and debugging. To debug and to root cause failures, the engineers need to pinpoint where the error occurs, or where the data packets or signals become corrupted. The most common method of debugging and rooting cause failure is to log all data and then parse the logged data through a script or application in order to extract data of interest. However, this may be ineffective and may use excessive data storage and time, especially when the engineers are working on targeted systems. In addition, these tasks are mundane, and take time away from quickly designing and developing high quality products at optimal cost.

SUMMARY

According to a representative embodiment, a method is provided for automating workflow of testing of a system under test (SUT) using a computing device. The method includes providing an interface on the computing device to multiple test instruments configured for testing the SUT to communicate with software applications and/or browsers respectively running on the multiple test instruments, where the interface includes multiple modes of connection; providing an optical character recognition (OCR) application on the computing device; providing a robotic process automation (RPA) application on the computing device; provide orchestration by controlling multiple test instruments via the interface to perform measurements of the SUT via the interface using the RPA application according to a predetermined test procedure; receiving and displaying test data from the multiple test instruments via the interface in response to the measurements; capturing the displayed test data and translating the captured test data to readable data using the OCR application; repeating the controlling of the multiple test instruments, the receiving and capturing of the test data, and the translating of the captured test data under control of the RPA application to acquire aggregated test data; and generating a report populated with at least the aggregated test data.

According to another representative embodiment, a system is provided for automating workflow of testing of a SUT. The system includes at least one processor; an interface configured to interface the at least one processor with multiple test instruments configured for testing the SUT to communicate with software applications and/or browsers respectively running on the test instruments, where the interface includes multiple modes of connection; a display including a graphical user interface (GUI) in communication with the at least one processor; and at least one non-transitory memory. The at least one memory stores instructions that, when executed by the at least one processor, cause the at least one processor to control the test instruments via the interface to perform measurements of the SUT via the interface using an RPA application according to a predetermined test procedure; receive test data from the test instruments via the interface in response to the measurements; display the test data on the display; capture the displayed test data and translating the captured test data to readable data using an OCR application; repeat the controlling of the test instruments, the receiving and capturing of the test data, and the translating of the captured test data under control of the RPA application to acquire aggregated test data; and generate a report populated with at least the aggregated test data.

According to another representative embodiment, a non-transitory computer readable medium is provided that stores instructions for automating workflow of testing of a SUT using a computing device interfacing with multiple test instruments via an interface. When executed by at least one processor, the instructions cause the at least one processor to control the test instruments via the interface to perform measurements of the SUT via the interface using an RPA application according to a predetermined test procedure, where the interface includes multiple modes of connection; receive test data from the test instruments via the interface in response to the measurements; display the test data; capture the displayed test data and translate the captured test data to readable data using an OCR application; repeat the controlling of the test instruments, the receiving and capturing of the test data, and the translating of the captured test data under control of the RPA application to acquire aggregated test data; and generate a report populated with at least the aggregated test data.

According to another representative embodiment, a method is provided for automating workflow of testing of a SUT using a computing device and at least one test instrument. The method includes providing an OCR application on the computing device; providing an RPA application on the computing device; receiving a trigger parameter and desired data of the SUT from a user via a graphical user interface (GUI) of the computing device; controlling the at least one test instrument to perform a measurement of the desired data using the RPA application in response to a trigger indicated by the trigger parameter according to a predetermined test procedure; receiving test data from the at least one test instrument in response to the measurement; displaying the test data at the GUI, where the test data is fluctuating during the measurement; capturing the displayed test data using the OCR application; performing a statistical operation on the captured test data using the RPA application to provide representative test data; and logging the representative test data using the RPA application.

According to another representative embodiment, a system is provided for automating workflow of a test of a SUT. The system includes at least one processor configured to communicate with at least one test instrument configured for testing the SUT; a display comprising a GUI in communication with the at least one processor; and at least one non-transitory memory storing instructions. When executed by the at least one processor, the instructions cause the at least one processor to receive a trigger parameter and desired data of the SUT from a user via the GUI; control the at least one test instrument to perform a measurement of the desired data using an RPA application in response to a trigger indicated by the trigger parameter according to a predetermined test procedure; receive test data from the at least one test instrument in response to the measurement; display the test data at the GUI, where the test data is fluctuating during the measurement; capture the displayed test data using an OCR application; perform a statistical operation on the captured test data using the RPA application to provide representative test data; and log the representative test data using the RPA application.

According to another representative embodiment, a non-transitory computer readable medium is provided that stores instructions for automating workflow of a test of a SUT. When executed by at least one processor, the instructions cause the at least one processor to receive a trigger parameter and desired data of the SUT from a user via a GUI; control the at least one test instrument to perform a measurement of the desired data using an RPA application in response to a trigger indicated by the trigger parameter according to a predetermined test procedure; receive test data from the at least one test instrument in response to the measurement; display the test data at the GUI, where the test data is fluctuating during the measurement; capture the displayed test data using an OCR application; perform a statistical operation on the captured test data using the RPA application to provide representative test data; and log the representative test data using the RPA application.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 4 is a schematic diagram of a method of logging data during testing of a SUT using a computing device and at least one test instrument, according to a representative embodiment.

DETAILED DESCRIPTION

Figure 1:
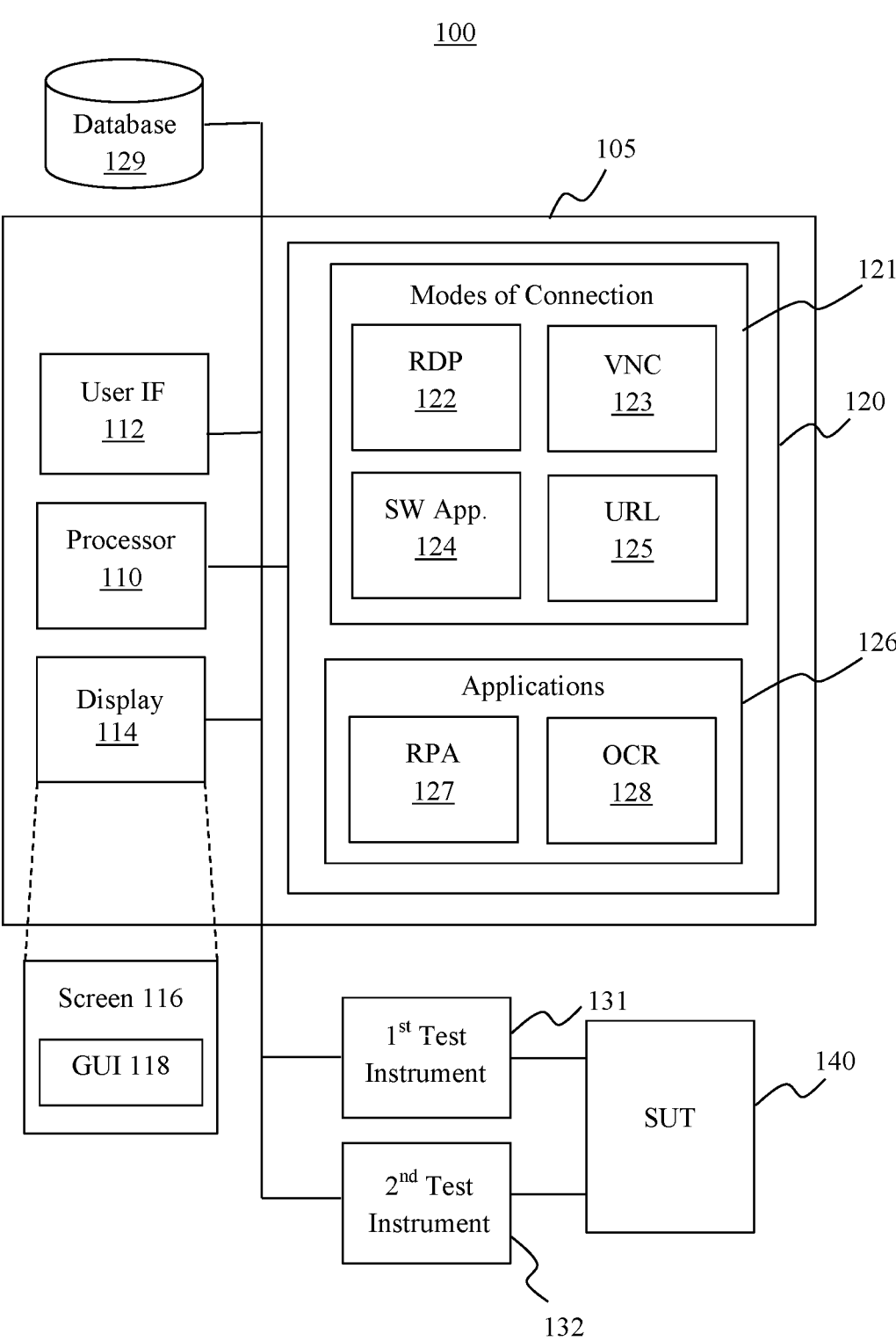
FIG. 1 is a simplified block diagram illustrating a system for automating testing of a SUT using a computing device, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

The various embodiments described herein enable automated testing and data analysis among multiple test instruments, software applications and browser simulators, using robotic process automation (RPA) and optical character recognition (OCR) applications for data analysis from multiple modes of connections. Such testing and data analysis are typically needed for complex testing and data analysis scenarios, such as quality assurance (QA) testing, new product introduction (NPI) testing phases, and failure analysis debugging. This capability reduces resources and time needed by a user, such as an R&D engineer or a quality assurance (QA) engineer, for example, to perform failure analysis or characterization of the new products.

FIG. 1 is a simplified block diagram illustrating a system for automating testing of a system under test (SUT) using a computing device, according to a representative embodiment.

Referring to FIG. 1, test system 100 includes a computing device 105 and one or more test instruments, indicated by representative first test instrument 131 and second test instrument 132. The first and second test instruments 131 and 132 are configured to perform testing of the SUT 140 under control of the computing device 105. The computing device 105 is configured to control operations of the first and second test instruments 131 and 132 to perform tests of the SUT 140, and to receive data collected by one or both of the first and second test instruments 131 and 132 for measuring various characteristics of the SUT 140.

In various embodiments, the computing device 105 may be a computer or workstation separate from the first and second test instruments 131 and 132, or the computing device 105 may be implemented within one or both of the first and second test instruments 131 and 132. The first and second test instruments 131 and 132 may be any device configured to obtain and process electronic data from the SUT 140, as would be apparent to one skilled in the art. For example, the first and second test instruments 131 and 132 may include a digital oscilloscope, a vector network analyzer (VNA), a spectrum analyzer, an arbitrary wave generator (AWG), or the like. Depending on test requirements, only one of the first and second test instruments 131 and 132 may be needed, or there may be additional test instrument(s) included, without departing from the scope of the present teachings. The first and second test instruments 131 and 132 may be connected to the SUT 140 via a test network, which may be implemented as a packet switching network, such as an intranet or internet, or a local network, such as an ethernet connection, or other wired or wireless local area network (LAN) or wide area network (WAN), for example.

The computing device 105 includes a processing unit 110 and a memory 120 for storing instructions executable by the processing unit 110 to implement the processes described herein. The processing unit 110 is representative of one or more processing devices, and is configured to execute software instructions to perform functions as described in the various embodiments herein. The processing unit 110 may be implemented by a general purpose computer, one or more processors, microprocessors or microcontrollers, a digital signal processor (DSP), a central processing unit (CPU), a graphics processing unit (GPU), a state machine, programmable logic devices, field programmable gate arrays (FP-GAs), application specific integrated circuits (ASICs), or combinations thereof, using any combination of hardware, software, firmware, hard-wired logic circuits, or combinations thereof. The term "processor," in particular, encompasses an electronic component able to execute a program or machine executable instructions. References to a processor should be interpreted to include more than one processor or processing core, as in a multi-core processor, and/or parallel processors.

The memory 120 may include a main memory and/or a static memory, where such memories may communicate with each other and the processing unit 110 via one or more buses. The memory 120 stores instructions used to implement some or all aspects of methods and processes described herein, including the methods described above with reference to FIGS. 2 and 4, for example. The memory 120 may be implemented by any number, type and combination of random access memory (RAM) and read-only memory (ROM), for example, and may store various types of information, such as software algorithms, data based models including neural network based models, and computer programs, all of which are executable by the processing unit 110. The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a USB drive, or any other form of storage medium known in the art. The memory 120 may for instance be multiple memories or databases local to the computer, and/or distributed amongst multiple computer systems or computing devices.

The memory 120 is a tangible, computer readable storage medium for storing data and executable software instructions, and is non-transitory during the time software instructions are stored therein. As used herein, the term "non-transitory" is to be interpreted not as an eternal characteristic of a state, but as a characteristic of a state that will last for a period. The term non-transitory specifically disavows fleeting characteristics such as characteristics of a carrier wave or signal or other forms that exist only transitorily in any place at any time. The memory 120 may store software instructions and/or computer readable code that enable performance of various functions. The memory 120 may be secure and/or encrypted, or unsecure and/or unencrypted. A computer readable storage medium is defined to be any medium that constitutes patentable subject matter under 35 U.S.C. § 101 and excludes any medium that does not constitute patentable subject matter under 35 U.S.C. § 101. Programs stored in the memory 120 having software instructions to be performed by the processing unit 110 may be within the same computing device 105 or distributed across one or more multiple computing devices.

The test system 100 may also include a database 129 for storing test data acquired during the test process. For example, the database 129 may store data received from the first and second test instruments 131 and 132, as well as measurements made by the computing device 105 and test reports, discussed below. The database 129 may be implemented by any number, type and combination of RAM and ROM, for example. The various types of ROM and RAM may include any number, type and combination of computer readable storage media, such as a disk drive, flash memory, EPROM, EEPROM, registers, a hard disk, a removable disk, tape, CD-ROM, DVD, floppy disk, Blu-ray disk, USB drive, or any other form of storage medium known in the art, as discussed above with regard to the memory 120. Likewise, the database 129 comprises tangible storage mediums for storing data and is non-transitory during the time data and software instructions are stored therein. The database 129 may be secure and/or encrypted, or unsecure and/or unencrypted. For purposes of illustration, the database 129 is shown as a separate storage medium, although it is understood that it may be combined with and/or included in the memory 120, without departing from the scope of the present teachings.

The computing device 105 also includes a user interface (IF) 112 and a display 114 connected to the processing unit 110 and the memory 120 via one or more buses. The user IF 112 enables information and data output by the processing unit 110 and/or the memory 120 to the user and/or for receiving information and data input by the user. That is, the user IF 112 enables the user to enter data and to control or manipulate aspects of the processes described herein, and also enables the processing unit 110 to indicate the effects of the user's control or manipulation. The user IF 112 may connect one or more user interfaces, such as a mouse, a keyboard, a mouse, a trackball, a joystick, a haptic device, a microphone, a video camera, a touchpad, a touchscreen, voice or gesture recognition captured by a microphone or video camera, for example, or any other peripheral or control to permit user feedback from and interaction with the processing unit 110.

The display 114 may include a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 114 may also provide a graphical user interface (GUI) 118 for displaying and receiving information to and from the user on a screen 116, e.g., a touch screen. That is, the display 114 includes the screen 116, as well as GUI 118 which enables the user to interact with displayed images and features. All or part of the user IF 112 may be implemented by the GUI 118.

In the depicted embodiment, the computing device 105 further includes multiple modes of connection 121 for connecting the computing device 105 to the first and second test instruments 131 and 132, and to software applications and browser simulators running on the first and second test instruments 131 and 132, respectively. The modes of connection 121 provide an interface between the processing unit 110 and the first and second test instruments 131 and 132. The modes of connection 121 include a Remote Desktop Protocol (RDP) application 122, a Virtual Network Computing (VNC) application 123, a software application 124, and a Uniform Resource Locator (URL) application 125. Using the modes of connection 121, the computing device 105 is able to connect with all types of test instruments regardless of the operating systems the test instruments may be running (e.g., Windows®-based and non-Windows®-based operating systems). The modes of connection 121 are shown as part of the memory 120, although it is understood that the modes of connection 121 may be included in one or more separate memories, without departing from the scope of the present teachings. Any number of the modes of connection 121 may be used for software applications running on the processing unit 110 to connect to the first and second test instruments 131 and 132, as well as the software applications and browser simulators running on the first and second test instruments 131 and 132.

The RDP application 122 includes server-based remote access software, such as RDP software developed by Microsoft®, for example. The RDP application 122 provides a network communications protocol that enables connection between computers remotely located from one another. In the depicted embodiment, the computing device 105 is able to remotely control operations of and receive data from the first and second test instruments 131 and 132 using the RDP application 122, as if the user were directly operating the first and second test instruments 131 and 132, e.g., using panel controls of the first and second test instruments 131 and 132.

The VNC application 123 includes computer-based remote access software, such as VNC software developed by RealVNC®, for example. The VNC application 123 provides screen sharing between computers remotely located from one another. The VNC application 123 enables a remote user to use another computer's screen, keyboard, mouse and the like from another computer. The VNC application 123 incorporates remote frame buffer (RFB) protocol to format data that passes between the client (e.g., first and second test instruments 131 and 132) and server (e.g., computing device 105) within the VNC system. The VNC application 123 is applicable to all windowing applications and systems, which means that it works across multiple platforms, such as Windows®, macOS, Linux®, Unix®, Android OS, and an embedded OS, for example. Therefore, the VNC application 123 may be used for a SUT 140 and/or first and second test instruments 131 and 132 that are not supported by the RDP application 122.

The software application 124 refers a simulation or other application built to communicate with the first and second test instruments 131 and 132, and to perform measurements according to the test. An example of the software application is event stream processing (ESP) software designed to implement event-driven architectures, such as the testing by the first and second test instruments 131 and 132. Yet another example is software to collect event-based data for practical artificial intelligence and machine learning solutions. Event-based data collections enables optimal management of huge amounts of data at the point of collection by allowing data of interest to be gathered at very specific time(s) or when specific event(s) occur(s), or when triggered by an event or a sequence of events in real-time.

The URL application 125 may include microservice applications running on the first and second test instruments 131 and 132, respectively, and/or may be provided by browser simulators. The URL application 125 may be implemented using LXI, for example. The URL application 125 enables interfacing with SUTs that are not on the same network and/or cannot be accessed using the RDP application 122 or the VNC application 123. The URL application 125 provides a channel for interfacing with a SUT 140 having a public facing web application. Also, the URL application 125 may be a web-based application hosted on a local PC, or hosted on a remote server or a cloud-based web application, for example.

Connections are made by the computing device 105 to the first and second test instruments 131 and 132 using the RDP in the RDP application 122 and the VNC protocol in the VNC application 123. The software applications and the browser simulators running on the first and second test instruments 131 and 132 may be opened utilizing the software application 124 and the URL application 125, respectively, in the C# window application API environment, for example. Therefore, all four modes of connection 121 are used for by the computing device 105 to control the test.

In the depicted embodiment, the computing device 105 further includes applications memory 126, which stores robotic process automation (RPA) application 127 and optical character recognition (OCR) application 128. Generally, the OCR application 128 converts images of text into a machine-readable and/or human readable text format. Notably, the OCR application 128 is not limited to text images, but may also convert non-text images into machine-readable and/or human readable format. The applications memory 126 is shown as part of the memory 120, although it is understood that the applications memory 126 may be include one or more separate memories, without departing from the scope of the present teachings.

The RPA application 127 may be implemented using known RPA applications, such as PathWave Instrument RPA, available from Keysight Technologies, for example. Alternatively, the RPA application 127 may be developed from a combination of known RPA applications, such as Eggplant Functional, for example. The RPA application 127 may be used to record and replay processes to configure software, or "robots," to capture and interpret information output by other applications, such as the OCR application 128, in order to read and manipulate data, trigger responses, and communicate with other applications, including RDP application 122, VNC application 123, the software application 124, and URL application 125, for example. Significantly, the RPA application 127 does not rely on drivers, APIs or complex low level coding for automation. Also, the RPA application 127 enables use of different operating systems (e.g., Windows®, macOS, and Linux®) without coding. For example, testing of the first and second test instruments may be performed by the computer device 105 using different operating systems, where the process and/or results are stitched together to provide a more robust analysis.

The OCR application 128 also may be implemented using known OCR applications, such as Eggplant Functional or Tensorflow OCR, for example. The OCR application 128 is able to capture and read test data in the form of on-screen characters and images displayed on the screen 116 of the display 114, and to convert the captured characters and images to machine and/or human readable data (e.g., text). For example, the OCR application 128 may be configured to convert screenshots or snipping images on the screen 116 to readable data. In an embodiment, the OCR application 128 may also convert the captured text and visual elements to human readable text, which may be displayed on the display 114 and/or used to populate a test report generated by the computing device 105, discussed below.

The OCR application 128 may help with parameterization by identifying test parameters of the test process and/or of the first and second test instruments 131 and 132 that the user would like to change during the test process. Examples of such test parameters include temperature, humidity, pressure, voltage, current, power, and corresponding set points. The changes to the identified test parameters are done automatically by the RPA application 127 by orchestration of the recorded script, for example. This keeps the user from having to make changes manually, streamlining the test process. The strengths of the OCR application 128 for data capturing on multi-mode connections and the RPA application 127 for automating repetitive tasks are combined for enhancing the testing of the SUT 140.

Testing of the SUT 140 may be automated by connecting the computing device 105 to the first and second test instruments 131 and 132, and triggering input data of the first and second test instruments 131 and 132 using the RPA application 127. The input data may be acquired with the software application 124 and/or the browser simulator from the URL application 125. For example, a smartphone simulator (an example of software application 124) may be used to trigger wireless connection emulation software or 5G network emulation software for testing an output signal of 5G/6G signal tower hardware on the computing device 105 (e.g., a spectrum analyzer). In the case, the RPA application 127 must trigger the first and second test instruments 131 and 132 and the software application 124 in sequence in order to do the testing.

The RPA application 127 also directs the OCR application 128 to capture data from the first and second test instruments 131 and 132, enabling seamless automation of the test process for data analysis and enabling linkage between the first and second test instruments 131 and 132 and the computing device 105. This simplifies the workflow for the user (e.g., an R&D engineer). Accordingly, the RPA application 127 is able to set test parameters, and initiate a measurement process of the SUT 140 via the first and second test instruments 131 and 132. The RPA application 127 may also adjust the values of one or more of the test parameters during the test process so that the test measurements reflect the affects of different test parameter values. Test measurements are captured by the OCR application 128 through character and image recognition, and are displayed on the display 114 and/or stored in the database 129. Upon receipt of the measurements, the RPA application 127 may repeat the measurement process of the SUT 140 a predetermined number of times, over a predetermined period, or until a predetermined result is obtained, for example. In an embodiment, the RPA application 127 may adjust one or more test parameters and then repeat the measurement process of the SUT 140 using the adjusted measurement parameters. In this manner, the RPA application 127 may repeat the test process (with or without altering test parameters) dozens or even thousands of times, while collecting corresponding test results via the OCR application 128, without further involvement of the user.

The computing device 105 may generate a report based on the information provided by RPA application 127 and the OCR application 128 over the course of the test process. The report may be displayed on the GUI 118 and/or stored in the database 129. The report may include an identification of the SUT 140, the values of the test parameters at different stages of the test, and corresponding measured values, for example. The report may also include trigger event(s) or sequence(s) that lead to capturing measurements, for example.

Therefore, the above embodiments provide an automated test using the OCR application 128 to convert a screenshot or snipping image on the screen 116 and translate it into readable text that the user wants to collect for analysis. The process may be repeated under control of the RPA application 127 to capture all the test data that the user wants for analysis over a long period of time, such as 5 days, for example, by simply looping the automation recording and observing data trends of the acquired test data. This may be achieved by a user who does not have complex programming skills or understanding of SCPI commands to otherwise capture the test data from the first and second test instruments 131 and 132 and also the software application.

Figure 2:
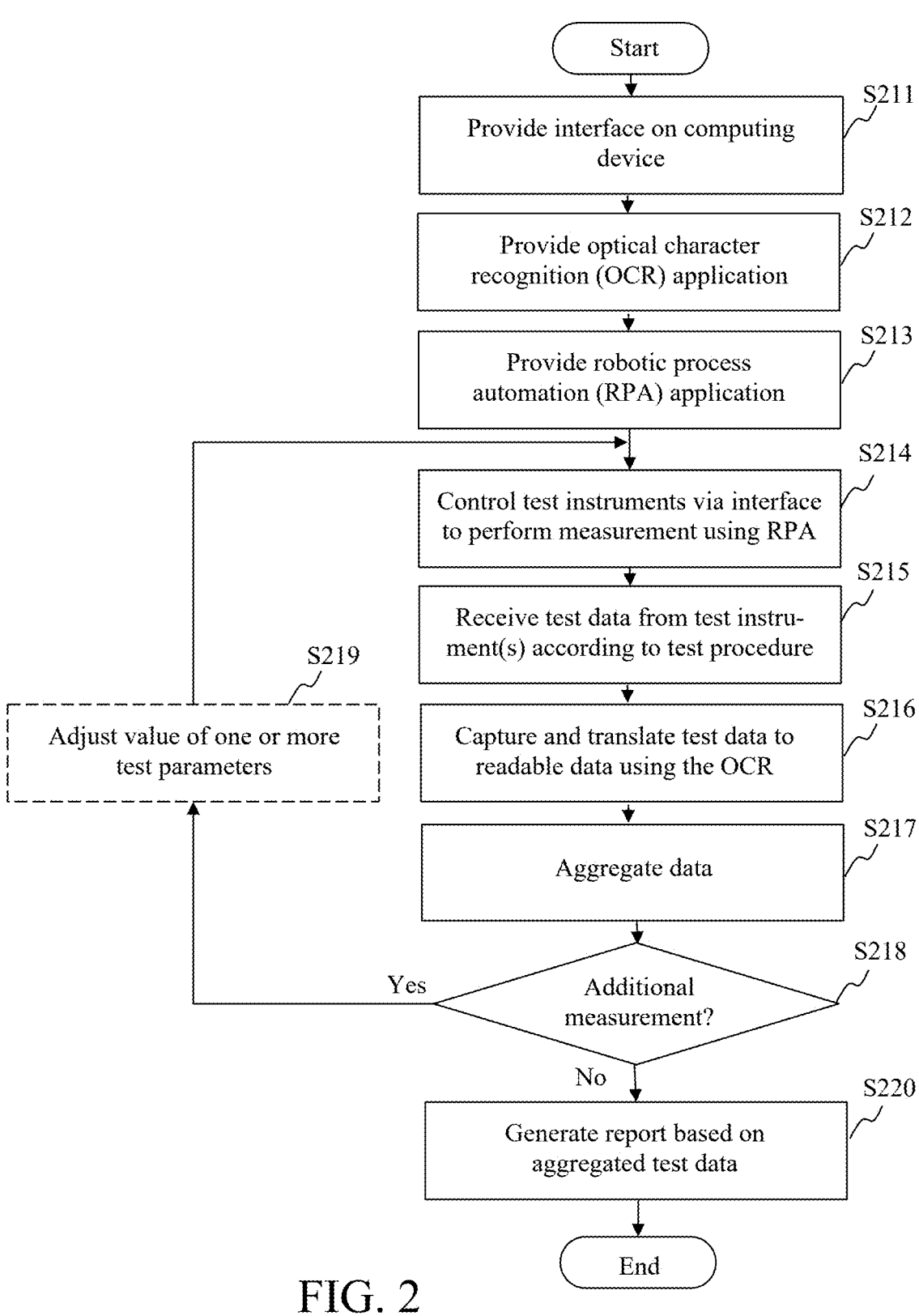
FIG. 2 is a flow diagram of a method for automating testing of a SUT using a computing device, according to a representative embodiment.

FIG. 2 is a flow diagram of a method for automating testing of a SUT using a computing device, according to a representative embodiment.

Referring to FIG. 2, an interface is provided on the computing device (e.g., computing device 105) in block S211. The interface enables the computing device to communicate with one or more test instruments (e.g., first and second test instruments 131 and 132) configured for testing the SUT, as well as software applications and/or browsers respectively running or interfacing on the computing device. As discussed above, the interface includes one or more of an RDP application, a VNC application, a software application, and a URL microservice application.

In block S212, an OCR application is provided on the computing device. The OCR application may be an off-the-shelf OCR application, such as Keysight PathWave Instrument RPA or Eggplant Functional, for example, although any compatible OCR application may be incorporated without departing from the scope of the present teachings.

In block S213, an RPA application is provided on the computing device, which communicates with the interface (e.g., RDP application 122, VNC application 123, software application 124, and/or URL application 125 modes of connection) and the OCR application. The RPA application may be an off-the-shelf RPA application, such as Keysight PathWave Instrument RPA or Eggplant Functional, for example, or may be customized for a particular computing device, test instruments, and/or test environment. Any compatible RPA application may be incorporated without departing from the scope of the present teachings.

Block S214 begins a measurement loop in which test data are repeatedly acquired from the one or more test instruments. That is, in block S214, the one or more test instruments are controlled via the interface (modes of connection) to perform a measurement of the SUT using the RPA application according to a predetermined test procedure of the test process, which may be recorded and used for replay/repetition. The RPA application may set values of parameters of the one or more test instruments via the interface before initiating the measurement. When the measurement is subsequent to an initial measurement, the RPA application may adjust values of one or more of the previously set parameters via the interface before initiating the current measurement, as discussed below.

In block S215, the measurement loop continues with receiving test data from the one or more test instruments via the interface under control of the RPA application. The test data may be received in real time or near real time, according to the predetermined test procedure. The test data are displayed as characters and/or images on the screen of the display.

In block S216, the displayed test data are captured and translated to readable data (e.g., text) using the OCR application. The test data to be translated may be identified by screenshots or snipping, for example. The readable data may be displayed to the user via the display and stored in a database (e.g., database 129). The readable data is also provided to the RPA application for monitoring the test procedure. By translating the test data to readable data, the test data is enhanced for extracting information for analysis and the test report.

In block S217, the readable data is combined with previously acquired readable data (if any) from previous measurement loops to provide aggregated test data. The aggregated test data is stored in the database as the test continues.

In block S218, the control unit determines whether additional measurements of the SUT are required, according to the predetermined test procedure. When additional measurements are required (block S218: Yes), the process returns to block S214 to begin the next measurement loop, in which the one or more test instruments are controlled via the interface to perform another measurement of the SUT under control of the RPA application. Optionally, the values of one or more test parameters may be adjusted by the RPA application before performing the next measurement, as indicated by dashed block S219. Blocks S215 to S218 are then repeated, using the same test parameters or using one or more adjusted test parameters, depending on the predetermined test procedure.

When additional measurements are not required (block S218: No), a report is generated in block S220. Also, one or more reports may be generated impromptu/on-demand or periodically, even though additional measurements are still required, thus allowing for on-the-fly checks and verification. The report may be populated with the aggregated test data from the measurement loops, as well as measurement results derived from the aggregated test data. The report enables analysis of the aggregated test data and/or the measurement results by the user. The report may also include test measurements or data triggered at specific times or when specific event(s) occur(s), or when triggered by an event or a sequence of events in real-time. For such cases, the report will include the event or chain of events that lead to the triggered measurements. This is useful in determining scenarios that occur intermittently or isolating causes of undesired events or desired events, depending on the respective scenarios. Alternatively, or in addition, an analysis may be performed automatically, e.g., by the computing device, by comparing the aggregated test data to predetermined thresholds or other measures indicating the quality of the measurements and/or the operation of the SUT.

In other embodiments, the RPA application 127 and the OCR application 128 are used to extract, compile, and log dynamic test data provided by the first and second test instruments 131 and 132 during testing of the SUT 140, where the dynamic test data is data that changes rapidly over time. Generally, logging test data is a crucial, universal step in test and measurement, especially with regard to increasing complexity of SUTs. However, conventional data logging logs all of the test data, which requires large amounts of storage and time, and may fail to capture the rapidly changing test data. The objective of data logging is to record measurements and/or events systematically over time. To this end, the OCR application 128 captures (raw) test data displayed on the screen 116, and temporarily stores the captured test data in a capture buffer (not shown).

Meanwhile, the RPA application 127 applies a statistical operation in-situ on the buffered test data to provide corresponding representative test data, which is a smaller amount of data than the captured test data. When the test data is captured over a defined time period, the statistical operation performed by the RPA application 127 may include averaging the test data, determining a mean of the test data, determining a minimum of the test data, or determining a maximum of the test data over the defined time period.

Alternatively, the statistical operation may include determining an instantaneous value of the test data at a trigger point of a trigger parameter. The statistical operation may also include probability of occurrence. The representative test data (and not the raw test data) is then logged for analytics. In an embodiment, the statistical analysis may be implemented using machine learning. As an example, the probability of occurrence of a particular measurement or data set occurring on the SUT 140 may be part of a larger dataset of statistical and/or machine learning operations on similar SUTs. When occurrences exceed a certain probability, the SUT 140 may be flagged for further debugging. Alternatively, even if failure occurs for a particular event or chain/sequence of events but the number of occurrences is lower than predicted by machine learning, the SUT 140 will not be flagged, but is regarded as being within acceptable level of operations. This is especially useful for modern SUTs, for which a huge amount of operations occur causing systems to be under stress for prolonged period of time. Failure is anticipated, as long as the occurrences do not exceed a threshold that could be determined statistically via machine learning. Yet another scenario is when the probability of occurrence is so low or has been identified as a fatal event, such that if it occurs, it should be flagged promptly and/or a report will be generated automatically and sent immediately.

By using the OCR application 128, the test process is software and platform (e.g., Windows®, macOS, Linux®, and Android OS) agnostic because the OCR application 128 collects the test data from the GUI 118. The RPA application 127 reduces the amount of test data needed for analytics, which enables the use of the OCR application 128 since the OCR application 128 is less accurate when attempting to capture large amounts of dynamic test data. This embodiment accelerates product development and insights into quality.

Monitoring and processing of the test data in this manner may be accomplished in real time, after a predetermined time period, or when triggered by certain trigger parameters (e.g., failure or breakdown). Without correctly logging the raw data, it is not possible to debug and root cause failures. Processed test data in test and measurement processes are typically used to identify events that lead to failure of the SUTs, and to identify weak and/or failing points to root cause failure modes. Data quality is important, which relies on capturing and monitoring the correct signal and/or test data. Also, precision logging of the dynamic test data via the OCR application 128 according to the various embodiments accelerates debugging and time to results for modern test systems and workflow.

Figure 3:
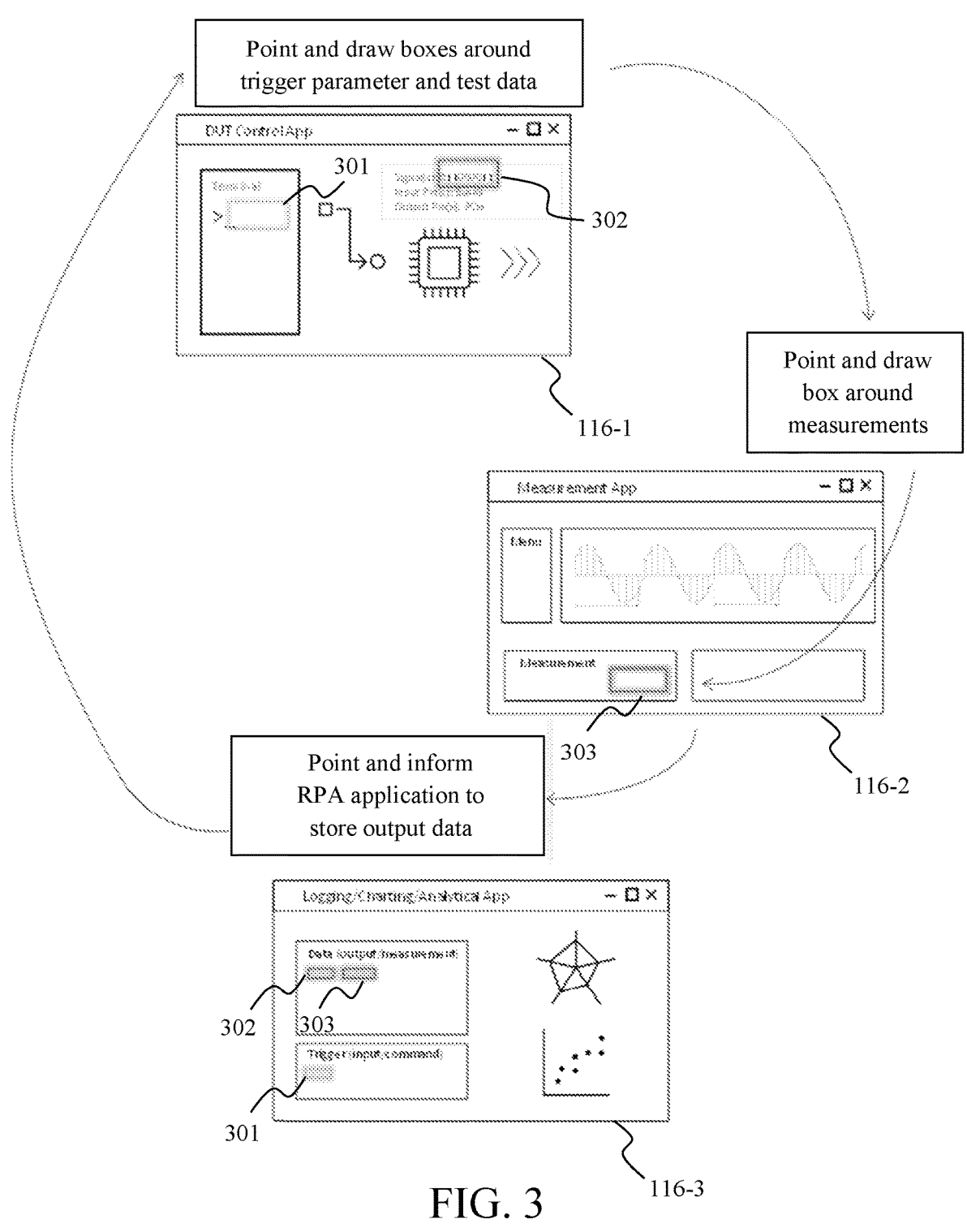
FIG. 3 is a schematic diagram showing interaction with a GUI for logging data during testing of a SUT using a computing device and at least one test instrument, according to a representative embodiment.

FIG. 3 is a schematic diagram showing interaction with a GUI for logging data during testing of a SUT using a computing device and at least one test instrument, according to a representative embodiment.

FIG. 3 shows illustrative screens 116 of the display 114 including the GUI 118. In first screen 116-1, the user points and draws a first box 301 around a trigger parameter, and draws a second box 302 around desired test data to be captured and logged. For example, the trigger parameter may be failure or breakdown and the test data may be voltage, frequency responses or protocol data unit. The RPA application 127 controls the first and second test instruments 131 and 132 to begin measurements of the data identified in box 302 in response to a trigger of the trigger parameter entered in box 301.

In second screen 116-2, the user points and draws a third box 303 around the measurements to be captured by the OCR application 128. For example, the measurements may be waveform spikes or flow of data containing characters of interest or a sequence of waveforms representing characters or binary digits.

In third screen 116-3, the trigger parameter from the first box 301, the test data to be captured and logged from the second box 302, and the measurements from the third box 303 are displayed. The user points and informs the RPA application 127 to store the output data, which includes the test data and/or the measurements. Analytics may be performed in real time without having to do any additional extraction or data parsing. This is because the RPA application 127 performs the statistical operation on the test data while the OCR application 128 is capturing the test data from the display 114. Since the OCR application 128 captures the test data from the display 114, no coding or scripting is required. The analytics may include debugging the SUT 140, for example.

The process is a repetitive loop, so it returns to box 301 where the user again identifies a trigger parameter and the test data to be captured in response to the trigger. The process repeats using multiple variables, which may be set manually by the user or automatically by the RPA application 127, for example. Stress testing may also be performed using parameters determined by the user or by the RPA application 127 based on the statistical operation.

FIG. 4 is a flow diagram of a method of logging data during testing of a SUT using a computing device (e.g., computing device 105) and one or more test instruments (e.g., first and second test instruments 131 and 132), according to a representative embodiment.

Referring to FIG. 4, in block S411, an OCR application is provided on the computing device. The OCR application may be an off-the-shelf OCR application, such as Keysight PathWave Instrument RPA or Eggplant Functional, for example, although any compatible OCR application may be incorporated without departing from the scope of the present teachings.

In block S412, an RPA application is provided on the computing device, which communicates with one or more test instruments, e.g., via the interface (modes of connection), and the OCR application. The RPA application may be an off-the-shelf RPA application, such as Keysight PathWave Instrument RPA or Eggplant Functional, for example, or may be customized for a particular computing device, test instruments, and/or test environment. Any compatible RPA application may be incorporated without departing from the scope of the present teachings.

In block S413, a trigger parameter and desired data of the SUT are received from a user via a GUI (e.g., GUI 118) of the computing device. The trigger parameter may be any variable or state of the SUT, the one or more test instruments, and/or the test environment that can be measured or otherwise determined during the test procedure, such as failure or breakdown, for example. The trigger parameter indicates a trigger, which occurs when the trigger parameter meets some predetermined value or indicates a predetermined event.

In block S414, the one or more test instruments are controlled to perform a measurement of the desired data using the RPA application in response to the trigger of the trigger parameter according to a predetermined test procedure. The one or more test instruments may be controlled via an interface, which may comprise various modes of connection, discussed above, although any compatible interface may be incorporated here without departing from the scope of the present teachings. The RPA application may set and/or adjust values of parameters of the one or more test instruments via the interface before initiating current measurements in a measurement loop.

In block S415, test data is received from the one or more test instruments in response to the measurement, according to the predetermined test procedure. The test data may be received (collected) using the RPA application.

Figure 5:
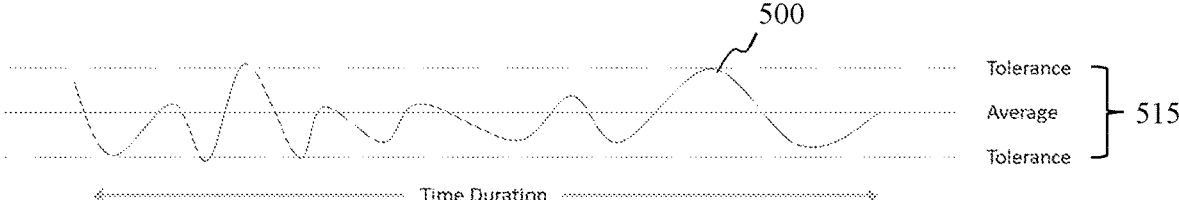
FIG. 5 is an illustrative time-series chart showing dynamic test data, according to a representative embodiment.

In block S416, the test data is displayed on a screen (e.g., screen 116) at the GUI. The test data may be dynamic, meaning that the values of the test data fluctuate or oscillate on the screen during the measurement. FIG. 5 is an illustrative time-series chart showing dynamic test data, according to a repetitive embodiment. Referring to FIG. 5, amplitude of dynamic test data signal 500 fluctuates over a predetermined time duration. The time-series chart includes a center line indicating an average data value of the dynamic test data, and upper and lower lines indicating a tolerance range 515 between upper and lower thresholds above and below the average data value, respectively. The tolerance range 515 may be determined statistically by RPA application or pre-set by the user, for example.

In block S417, the displayed test data displayed on the screen of the GUI is captured using the OCR application. The OCR application may capture the test data displayed on the screen of the GUI in a continuous fashion. Alternatively, the OCR application may capture the test data displayed on the screen of the GUI non-continuously, which may include capturing the test data discretely or at point-in-flight or instantaneously. For instantaneous capturing, the data is captured at the point of the trigger, discussed above.

In block S418, a statistical operation is performed on the captured test data using the RPA application to provide representative test data, and in block S419, the representative test data are logged in a database (e.g., database 129) using the RPA application. The representative test data are some representation or subset of the test data collected by the OCR application that is less than the whole amount of test data. In an embodiment, the captured test data may be temporarily stored in a capture buffer, such that RPA application performs the statistical operation on the captured test data retrieved from the capture buffer.

The RPA application may be configured to handle dynamic test data on the display screen in a variety of ways, including an auto process, a pre-set process, and a hybrid process combining auto and pre-set processes. In response to the trigger (automatically detected or entered by the user), the RPA application captures values of the test data on the screen, periodically or continuously, within the predetermined time duration. Once the captured values fall within the tolerance range 515, the RPA application logs and pushes out the average data of the test data, for example. Maximum, minimum, and other statistical information representing the test data may also be determined by the RPA application.

The RPA application may provide representative test data by alternative methods. For example, the RPA application may log and push out an instantaneous measurement value of the test data at a point of trigger. There is a chance that the OCR application will not accurately capture some values of the test data captured on-screen, e.g., due to fluctuations of the dynamic test data that are too fast or changing too rapidly for the OCR application to handle. In such scenarios, the RPA application may opt to capture the instantaneous measurement values of the test data, drop those values that can not be deciphered deterministically, and aggressively estimate values with the highest likelihood of accuracy. To ensure validity and confidence in the representative data that is logged, the RPA application may measure deviations between estimated values and values that are captured and identified with a very high level of probability.

Alternatively, the RPA application may log and push out median measurement data. In this case, the RPA application may be configured to evaluate the test data captured on the screen by the OCR application, and through an internal engine, create a histogram to determine the most representative data to log as the median measurement data. Or, the RPA application may similarly create a boxplot that places a box around the most representative data, and allows for easy identification of outliers. In this case, the RPA application may then determine whether to include or exclude the outliers, and/or purge test data resulting from data inconsistency or having low confidence levels.

The various embodiments enable automation and data gathering from multiple test instruments, software applications and browser simulators. A user is able to repeatedly capture data from the automated flow or from interactions between the modes of connections. The embodiments also simplify for users the process of setting up and testing with data collection on multiple modes of connections, which are interdependent.

In accordance with various embodiments of the present disclosure, the methods described herein may be implemented using a hardware computer system that executes software programs stored on non-transitory storage mediums. Further, in an exemplary, non-limited embodiment, implementations can include distributed processing, component/object distributed processing, and parallel processing. Virtual computer system processing may implement one or more of the methods or functionalities as described herein, and a processor described herein may be used to support a virtual processing environment.

While the disclosure has been illustrated and described in detail in the drawings and foregoing description, such illustration and description are to be considered illustrative or exemplary and not restrictive; the disclosure is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

The illustrations of the embodiments described herein are intended to provide a general understanding of the structure of the various embodiments. The illustrations are not intended to serve as a complete description of all of the elements and features of the disclosure described herein. Many other embodiments may be apparent to those skilled in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

Aspects of the present disclosure may be embodied as an apparatus, method or computer program product. Accordingly, aspects of the present invention may take the form of an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A system for automating workflow of a test of a system under test (SUT), the system comprising:

at least one processor;

an interface between the at least one processor and a plurality of test instruments configured for testing the SUT to communicate with software applications and/or browsers respectively running on the plurality of test instruments, wherein the interface comprises a plurality of different modes of connection for communicating with the software applications and/or the browsers respectively running on the plurality of test instruments;

a display comprising a graphical user interface (GUI) in communication with the at least one processor; and at least one non-transitory memory storing instructions that, when executed by the at least one processor, cause the at least one processor to:

control the plurality of test instruments via at least two modes of connection of the plurality of different modes of connection of the interface to perform measurements of the SUT during the test using a robotic process automation (RPA) application according to a predetermined test procedure;

receive test data from the plurality of test instruments via the interface in response to the measurements, wherein at least a portion of the test data comprises dynamic test data that changes over time;

display the dynamic test data on the display;

capture the displayed test data and translate the captured test data to readable data using an optical character recognition (OCR) application, wherein the readable data comprises one or more numerical values representative of the dynamic test data over time;

repeat the controlling of the plurality of test instruments, the receiving and capturing of the test data, and the translating of the captured test data under control of the RPA application to acquire aggregated test data; and generate a report populated with at least the aggregated test data.

2. The system of claim 1, wherein the plurality of different modes of connection comprise at least two of a Remote Desktop Protocol (RDP) application, a Virtual Network Computing (VNC) application, a software application, or a Uniform Resource Locator (URL) microservice application.

3. The system of claim 1, wherein execution of the instructions further cause the at least one processor to:

trigger a next predetermined test procedure based on the aggregated test data; and receive test data via the interface from the plurality of test instruments while testing the SUT according to the next predetermined test procedure.

4. The system of claim 3, wherein execution of the instructions further cause the at least one processor to:

automatically change at least one setting of at least one instrument of the plurality of test instruments prior to triggering the next predetermined test procedure using the RPA application.

5. The system of claim 1, wherein capturing the test data and translating the captured test data to readable data using the OCR application comprises monitoring the display of the test data and identifying a trigger event in the captured test data.

6. The system of claim 1, wherein capturing the displayed test data comprises capturing a snipping image or a screenshot of the displayed test data.

7. The system of claim 1, wherein the report includes an identification of the SUT, values of test parameters at different stages of the test and corresponding measured values, and/or a trigger event that leads to capturing the measurements.

8. The system of claim 1, wherein the instructions further cause the at least one processor to:

provide the readable data to the RPA application for monitoring the test procedure; and adjust values of one or more test parameters via the interface using the RPA application based on the monitoring before performing a next measurement of the SUT.

9. A method of automating workflow of a test of a system under test (SUT) using a computing device, the method comprising:

providing an interface between the computing device and a plurality of test instruments configured for testing the SUT to communicate with software applications and/or browsers respectively running on the plurality of test instruments, wherein the interface comprises a plurality of different modes of connection for communicating with the software applications and/or the browsers respectively running on the plurality of test instruments;

providing an optical character recognition (OCR) application on the computing device;

providing a robotic process automation (RPA) application on the computing device;

controlling the plurality of test instruments via at least two of the plurality of different modes of connection of the interface to perform a measurement of the SUT during the test using the RPA application according to a predetermined test procedure;

receiving and displaying test data from the plurality of test instruments via the interface in response to the measurement, wherein at least a portion of the displayed test data comprises dynamic test data that changes over time;

capturing a screenshot or a snipping image of the displayed test data and translating the captured test data to readable data using the OCR application, wherein the readable data comprises one or more numerical values representative of the dynamic test data over time;

repeating the controlling of the plurality of test instruments, the receiving and capturing of the test data, and the translating of the captured test data under control of the RPA application to acquire aggregated test data; and generating a report populated with at least the aggregated test data.

10. The method of claim 9, wherein the plurality of different modes of connection comprise at least two of a Remote Desktop Protocol (RDP) application, a Virtual Network Computing (VNC) application, a software application, or a Uniform Resource Locator (URL) microservice application.

11. The method of claim 9, further comprising:

triggering a next predetermined test procedure based on the aggregated test data; and receiving test data via the interface from the plurality of test instruments while testing the SUT according to the next predetermined test procedure.

12. The method of claim 11, further comprising:

automatically changing at least one setting of at least one instrument of the plurality of test instruments prior to triggering the next predetermined test procedure using the RPA application.

13. The method of claim 9, wherein capturing the test data and translating the captured test data to readable data using the OCR application comprises monitoring a display of the test data and identifying a trigger event in the captured test data.

14. The method of claim 9, wherein capturing the displayed test data comprises capturing a snipping image or a screenshot of the displayed test data.

15. A non-transitory computer readable medium storing instructions for automating workflow of a test of a system under test (SUT) using a computing device interfacing with a plurality of test instruments via an interface, wherein when executed by at least one processor, the instructions cause the at least one processor to:

control the plurality of test instruments via a plurality of different modes of connection of the interface to perform measurements of the SUT during the test using a robotic process automation (RPA) application according to a predetermined test procedure, wherein the plurality of different modes of connection communicate with software applications and/or browsers respectively running on the plurality of test instruments;

receive test data from the plurality of test instruments via the interface in response to the measurements, wherein at least a portion of the test data comprises dynamic test data that changes over time;

display the dynamic test data;

capture a screenshot or a snipping image of the displayed test data and translate the captured test data to readable data using an optical character recognition (OCR) application, wherein the readable data comprises one or more numerical values representative of the dynamic test data over time;

repeat the controlling of the plurality of test instruments, the receiving and capturing of the test data, and the translating of the captured test data under control of the RPA application to acquire aggregated test data; and generate a report populated with at least the aggregated test data.

16. The non-transitory computer readable medium of claim 15, wherein the plurality of different modes of connection comprise at least two of a Remote Desktop Protocol (RDP) application, a Virtual Network Computing (VNC) application, a software application, or a Uniform Resource Locator (URL) microservice application.

17. The non-transitory computer readable medium of claim 15, wherein execution of the instructions further cause the at least one processor to:

trigger a next predetermined test procedure based on the aggregated test data; and receive test data via the interface from the plurality of test instruments while testing the SUT according to the next predetermined test procedure.

18. The non-transitory computer readable medium of claim 17, wherein execution of the instructions further cause the at least one processor to:

automatically change at least one setting of at least one instrument of the plurality of test instruments prior to triggering the next predetermined test procedure using the RPA application.

19. The non-transitory computer readable medium of claim 15, wherein capturing the test data and translating the captured test data to readable data using the OCR application comprises monitoring the display of the test data and identifying a trigger event in the captured test data.

20. The non-transitory computer readable medium of claim 15, wherein the report includes an identification of the SUT, values of test parameters at different stages of the test and corresponding measured values, and/or a trigger event that leads to capturing the measurements.

\* \* \* \* \*